United States Patent [19]

Kim et al.

[11] Patent Number: 5,427,649
[45] Date of Patent: Jun. 27, 1995

[54] METHOD FOR FORMING A PATTERN BY SILYLATION

[75] Inventors: Cheol-hong Kim; Woo-sung Sung, both of Suwon, Rep. of Korea

[73] Assignee: Samsung Electronics Co., Ltd., Suwon, Rep. of Korea

[21] Appl. No.: 153,928

[22] Filed: Nov. 18, 1993

[30] Foreign Application Priority Data

Nov. 18, 1992 [KR] Rep. of Korea .................. 21641-92

[51] Int. Cl.⁶ ............................................ H01L 21/00
[52] U.S. Cl. ............................................... 156/661.11
[58] Field of Search ................... 156/659.1, 661.1, 643, 156/646, 668, 650, 652

[56] References Cited

U.S. PATENT DOCUMENTS

| | | | |
|---|---|---|---|
| 4,615,782 | 10/1986 | Namatsu et al. | 156/661.1 |
| 4,751,170 | 6/1988 | Mimura et al. | 430/313 |
| 5,270,151 | 12/1993 | Agostino et al. | 430/313 |
| 5,286,607 | 2/1994 | Brown | 430/313 |

FOREIGN PATENT DOCUMENTS

| | | |
|---|---|---|
| 2-304922 | 12/1990 | Japan . |
| 4-176123 | 6/1992 | Japan . |

Primary Examiner—Nam Nguyen
Assistant Examiner—George Goudreau
Attorney, Agent, or Firm—Charles R. Donohoe; Robert A. Westerlund, Jr.; Stephen R. Whitt

[57] ABSTRACT

A method for forming a mask pattern using a multi-layer photoresist film process is disclosed. The processing is simplified from known processes by using a silylated photoresist film. A first photoresist layer is formed on substrate and part of the surface of the photoresist layer is silylated to thereby form a silylation layer. Then, a second photoresist layer is formed on the silylation layer, which is then exposed through the photo mask having a predetermined pattern. A second photoresist pattern is then formed after development. Then, a silylation layer pattern is formed by etching-back the silylation layer using the second photoresist pattern as an etching mask. The silylation pattern is then oxidized, and the first photoresist layer is etched using the oxidized silylation pattern, thereby forming a first photoresist pattern. A resolution increasing effect can be maintained using the two layer photoresist film structure without the need for an intermediate oxide film. Thus, the process is simplified and less undesired polymers are generated.

4 Claims, 5 Drawing Sheets

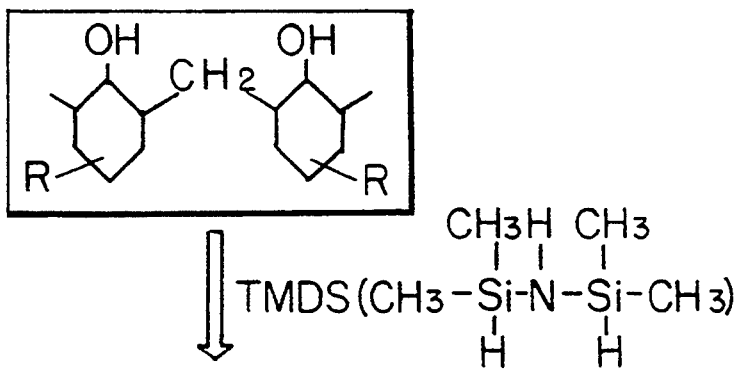

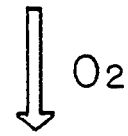

METHOD FOR FORMING A PATTERN BY SILYLATION

BACKGROUND OF THE INVENTION

The present invention relates to a method for forming a pattern using a photoresist film in the manufacturing process of semiconductor device, and more particularly, to a method for forming a pattern which can be manufactured by using only the two layer photoresist film by silylating the photoresist film, having maintained the resolution increasing effect which is caused by a multi-layer resist film process (hereinafter, called "MLR" process).

In general, the thickness of a first photoresist film disposed directly over the wafer differs from that of a second photoresist film disposed over the first photoresist film. Accordingly, in the subsequent exposure process the second thin photoresist film is excessively exposed while the thick first photoresist film is insufficiently exposed. Therefore, during the development process, the line width of the resist pattern varies. Specifically, the line width of the overexposed second photoresist film becomes much narrower than the underexposed first photoresist film.

In addition to this problem, the minimum resolution value is decreased due to the so-called standing wave effects in the thick-formed first resist layer, and the reflected lower substrate also makes the resolution worse.

Also, when the thin second resist film is used, the problem of the standing wave effect and the lowering of the resolution generated from the reflective substrate can be overcome. However, it is impossible to overcome the limitation of the step coverage.

To overcome the above problem, an MLR process has been proposed. This processing combines the thick planarized resist layer and the thin image transcribing layer, thereby forming the resist pattern (see Silicon Processing for the VLSI Era, S. Wolf and R. N. Tauber, Vol. 1, 1986, pp 424).

The conventional method for forming the pattern by the general known MLR processing will be explained with reference to the attached FIGS. 1A to 1H.

First, as shown in FIG. 1A, a first photoresist layer 11 is formed on a wafer 10. Though wafer 10 is shown as flat, the surface of the wafer includes the various step region depending on the shape of the surface. The first photoresist layer 11 is formed thick enough to flatten this surface.

Then, as shown in FIG. 1B, first photoresist layer 11 is neutralized, and is soft-baked on a hot plate for I minute or more at the temperature of 200°-250° C., in order to vaporize the solvent in the resist. At this time, the resin component in first photoresist layer 11 and the photo active compound (PAC) are cross-linked, to thereby form a hardened first photoresist pattern 12.

Then, as shown in FIG. 1C, an oxide film 13 is deposited thin on the hardened first photoresist layer 12. As another method, the oxide film of silane ($SiH_4$) base is dispersed and spinned at the spin on glass (SOG) spin coater, and baked at a temperature of 200°-240° C., thereby forming the oxide film 13.

Then, as shown in FIG. 1D, a second photoresist layer 14 is deposited thin on the oxide film 13.

Then, as shown in FIG. 1E, a ultra-violet light 15 is first irradiated to a photo mask 16 wherein the predetermined pattern is formed, and transcribes the pattern formed in photo mask 16 to second photoresist layer 14.

The PAC component of the region of second photoresist layer 14 lighted through photo mask 16 is destroyed, which then is washed by the developing solution in the subsequent development process.

As shown in FIG. 1F, a second photoresist pattern 18 remains and is formed by the development process. Only the portion of second photoresist layer 14 which was not irradiated to the ultra violet light 15 remains.

Then, as shown in FIG. 1G, an oxide film pattern is formed by etching an oxide film 13 formed in the lower part using second photoresist pattern 18 as an etching mask layer.

As shown in FIG. 1H, first photoresist layer 12 is etched using the pattern of oxide film 13 as an etching mask layer. As a result, a pattern consisted of the first photoresist layer 12 and oxide film 13 are formed on wafer 10.

A method for forming the pattern by the conventional MLR processing transcribes well the pattern of the photo mask, even a wafer whose surface is extremely uneven. Therefore, the resolution is increased and the depth of focus becomes deeper.

However, in the conventional MLR processing, the resist has to be formed twice and the oxide film has to be formed as an intermediate layer, which requires a baking process performed at a high temperature. Facilities for etching the oxide film are additionally needed. The addition of this complicated processing results in lower productivity, increased density, and increased cost.

Additionally, when the conventional MLR method is used, the by-products of the structure material such as a polysilicon layer, oxide film, or a metal layer formed on the wafer become attached to the sidewall of the resist in the course of etching the resist film. These by-products react with the resist, thereby forming a polymer. This polymer remains even after the resist removing process is completed, and causes further defects.

SUMMARY OF THE INVENTION

It is an object of the present invention to provide a method for forming a mask pattern which reduces the problem associated with the conventional MLR process, and provides a further simplified process while retaining the resolution increasing effect.

According to the present invention, part of the surface of the first photoresist layer is silylated and the silylation pattern is made into a glass with oxygen. The first photoresist layer below the silylation pattern is etched using the silylation pattern as an etching mask. Therefore, the intermediate oxide film used in the conventional MLR processing is not necessary. As a result, the process for forming the mask pattern is simplified.

Additionally, when the silylation is oxidized, the oxide film can include $SiO_x$-structured organic matters different from the pure oxide silicon film $SiO_2$. Therefore, polymers formed by the impurities decrease significantly as compared to the conventional MLR processing.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS OF THE INVENTION

Figure 1A:
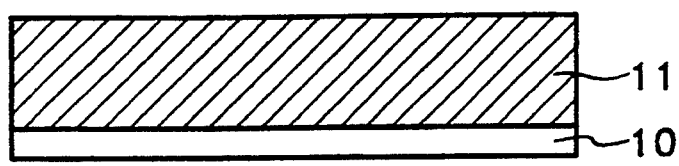
FIGS. 1A to 1H are cross-sectional views showing a method for forming the conventional multi-layer photoresist film pattern.
Figure 1B:
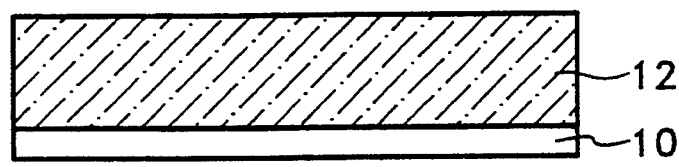
Figure 1C:
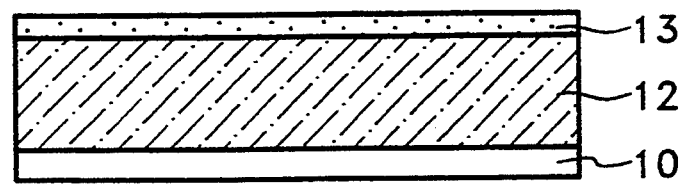
Figure 1D:
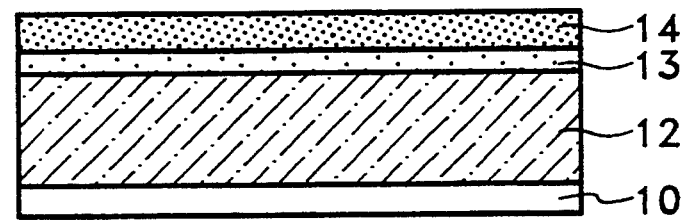
Figure 1E:
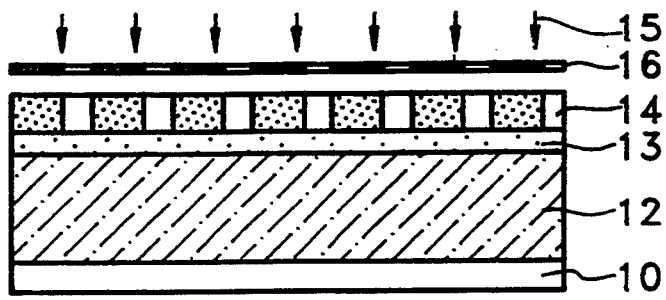
Figure 1F:
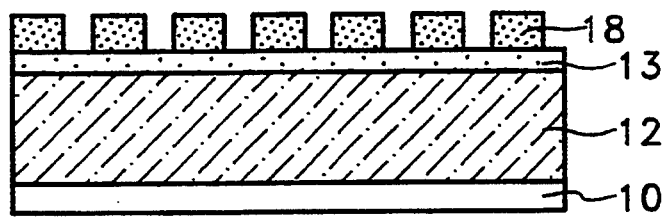
Figure 1G:
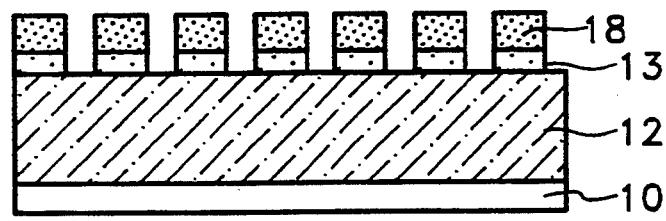
Figure 1H:
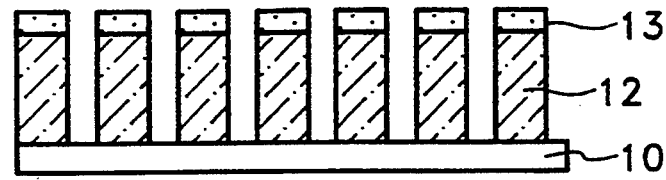
Figure 2A:
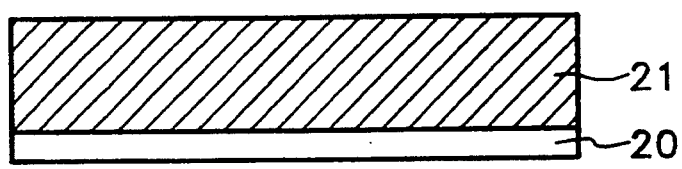
FIGS. 2A to 2F are cross-sectional views showing an embodiment of the method for forming a two-layer photoresist film pattern according to the present invention.

FIG. 2A shows the step of forming a chemical amplification resist 21 on wafer 20. In general, wafer 20 has a uneven surface even though it appears planarized in FIG. 2A. Chemical amplification resist 21 is made using an acid generator instead of the conventional photosensitive aid. There are two types of chemical amplification resist: posi-type and nega-type. Posi-type generates acid by an exposure, and this acid reacts with a base resin, which then forms an alkaline soluble body through baking process. In a nega-type resist, the acid react with a base resin by inserting a crossing material through baking process, which then forms an alkaline insoluble body. XP 89131 - 1.0 $\mu m$ resist of Shipley Co., i.e., a nega-type resist, is used for the preferred embodiment of the present invention, as a chemical amplification resist.

Figure 2B:
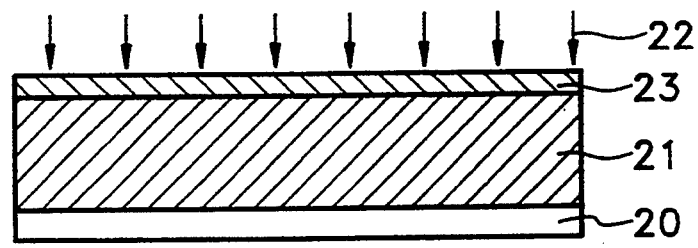

FIG. 2B shows the step of forming a silylation layer 23 by silylating part of the surface of chemical amplification resist layer 21. The silylation process diffuses a silylating agent 22 which includes silicon to the organic compounds which includes an activation hydrogen ion (for example, —OH, —NH, —SH). At this time, the developing speed is changed since the diffusion region is hardened. As silylating agent 22, the present invention uses tetra-methyl di-silazane (TMDS) which includes silicon, however, hexamethyl disilazane (HMDS), ATMS, DMSDMA, Silane, etc., also can be used.

Resin which contains silicon is made from the substitutional reaction between silylating agent 22 and the hydrogen component of —OH radical in chemical amplification resist 21. Accordingly, resists such as novolac, polyvinylphenol can be used instead of the chemical amplification resist previously described, since the hydrogen component of —OH radicals and the silylating agent can be mutually substituted.

Further, to obtain the silylation layer, TMDS is used in a PLASMASTER-SI of JSR Co. (silylation equipment), set at a temperature of 120° C. and for 110 seconds.

Figure 2C:
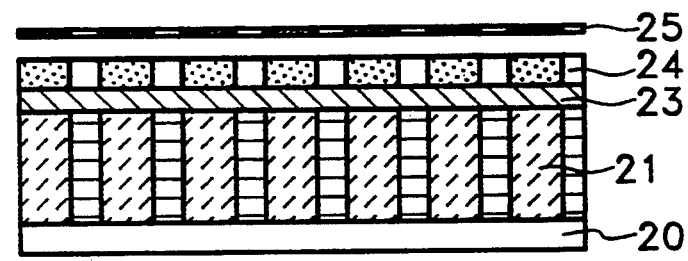

FIG. 2C shows the step of forming a second photoresist layer 24 on silylation layer 23, and exposing second photoresist layer 24 through a photo mask 25 wherein the predetermined pattern is formed. Second photoresist 24 used for an embodiment of the present invention is ip-1800 of TOK Co. The PAC component which exists in second photoresist 24 of the region where the light reaches through photo mask 25 is destroyed. At this time, first photoresist 21 below the silylation layer 23 is also reached by the light, thereby destroying its PAC component. The exposure time is 600 msec.

Figure 2D:
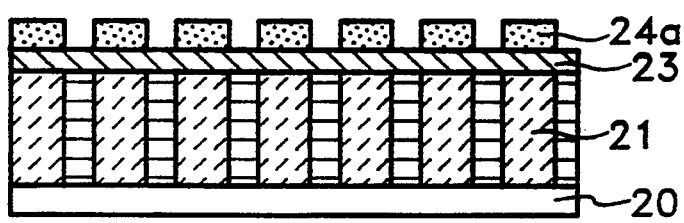

FIG. 2D shows the step of forming a second photoresist pattern 24a formed by the remaining second photoresist layer of the region where the light doesn't reach, through the development process.

Figure 2E:
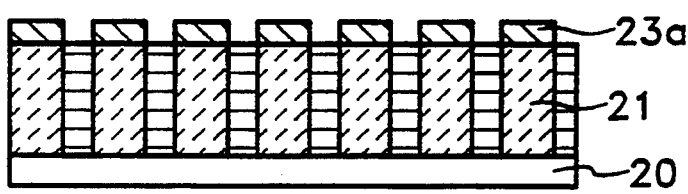

FIG. 2E shows the step of forming a silylation layer pattern 23a by an etch-back process using second photoresist pattern 24a as an etching mask. The etch-back is performed under the condition that $O_2$ 5 sccm, $N_2$ 5 sccm and He 120 sccm, and RF electric power 2.0 Kw, and the time for 60 seconds. At this time, the silylation layer 23 exposed below second photoresist pattern 24a is etched to form a silylation layer pattern 23a. During this etch-back process, the second photoresist pattern 24a is etched at the same time as the exposed parts of silylation layer 23. Thus, when the silylation layer 23 is etched to form silylation layer pattern 23a, the second photoresist pattern 24a is removed by etching.

Figure 2F:
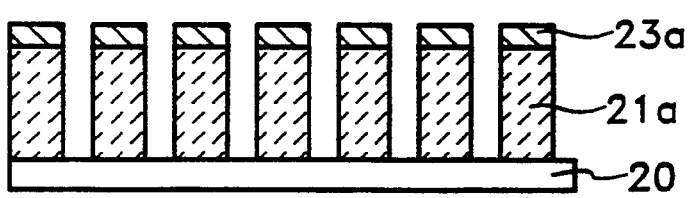

FIG. 2F shows the step of oxidizing silylation layer pattern 23a using oxygen, and then, etching a first photoresist layer 21 using silylation layer pattern 23a changed to $SiO_x$ structure as an etching mask. As a result, a first photoresist pattern 21a is formed on wafer 20.

Figure 3A:
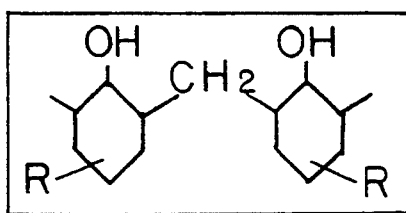
FIGS. 3A to 3C are chemical structural views showing the photoresist film, the silylation compounds thereof and the oxidized compounds according to the present invention.
Figure 3B:
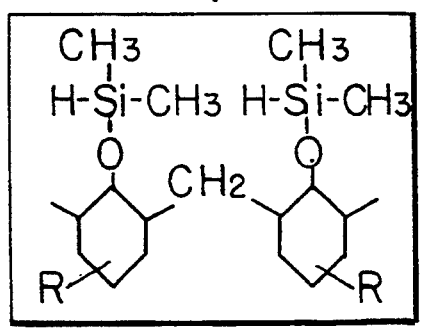
Figure 3C:
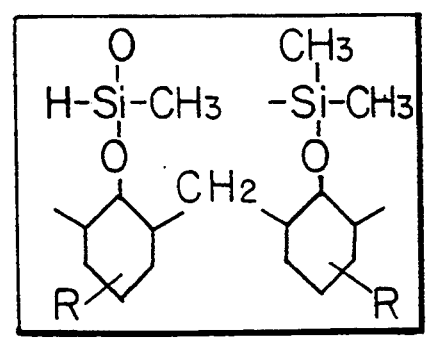

FIGS. 3A–3C are chemical structural views showing the silylation of the photoresist used for an embodiment of the present invention, and the oxidized compounds. FIG. 3(A) indicates a structure of the resin in the chemical amplification resist, and FIG. 3(B) is a structural view showing that the compounds silylated by putting the silylating agent TMDS used for an embodiment of the present invention into an reactor. FIG. 3(C) shows the structure of the resultant compound oxidizing the above silylated resist under the oxygen atmosphere.

As shown in the above described embodiment of the present invention, since the present invention uses a single photoresist layer instead of the lower first photoresist layer and the intermediate oxide film as required with the conventional MLR process for forming a pattern, the method for forming a pattern is simplified. In addition to this, since an oxide film which contains $SiO_x$-structured organic substances as shown in FIG. 3(C) is used in the present invention instead of the pure oxide film $SiO_2$ used for an intermediate film in the conventional method, polymers formed by impurities decrease when the lower substrate is etched. Experiment has shown that the formation ratio of the polymer is decreased up to 1/10–1/100. Therefore, the lower resist layer can be completely removed, to thereby decrease defect density.

It should be understood although preferred embodiments of the invention have been described in detail above, many modifications and variations could be effected therein by one with ordinary skill in the art without departing from the spirit and scope of the invention, as defined by the appended claims.

What is claimed is:

1. A method for forming a photoresist pattern, comprising the steps of:
   forming a first photoresist layer on a semiconductor substrate;
   silylating a surface portion of said first photoresist layer to form a silylated layer;
   forming a second photoresist layer on said silylated layer;
   forming a second photoresist pattern by exposing and developing said second photoresist layer using a photo mask, said second photoresist pattern leaving exposed portions of said silylated layer;
   etching back said exposed portions of said silylated layer using said second photoresist pattern as an etching mask to form a silylated layer pattern while etching back said second photoresist pattern;

oxidizing said silylated layer pattern; and etching said first photoresist layer using said oxidized silylated pattern as an etching mask to obtain the photoresist pattern on the substrate.

2. A method for forming a photoresist pattern according to claim 1, wherein said first photoresist layer is comprised of an organic compound which can be silylated.

3. A method for forming a photoresist pattern according to claim 2, wherein said first photoresist layer is comprised of any one selected from the groups consisting of chemical amplification resist system, novolac based resist and polyvinylphenol based resist.

4. A method for forming a photoresist pattern according to claim 1, wherein said step of silylating is performed by using as a silylating agent selected from the group consisting of TMDS, HMDS, ATMS, DMSDMA, and Silane.

* * * * *